United States Patent
Lasserre et al.

(10) Patent No.: US 9,141,561 B2
(45) Date of Patent: Sep. 22, 2015

(54) MASTER CIRCUITS HAVING DYNAMIC PRIORITY LEADS COUPLED WITH MEMORY CONTROLLER

(71) Applicant: Texas Instruments Incorporated, Dallas, TX (US)

(72) Inventors: Serge Bernard Lasserre, Plascassier (FR); Marouane Berrada, Nice (FR); Stephen Busch, Grasse (FR); Denis Beaudoin, Rowlett, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 218 days.

(21) Appl. No.: 13/672,082

(22) Filed: Nov. 8, 2012

(65) Prior Publication Data

US 2014/0122790 A1    May 1, 2014

(30) Foreign Application Priority Data

Oct. 25, 2012    (EP) .................................. 12290371

(51) Int. Cl.
*G06F 12/00* (2006.01)
*G06F 13/00* (2006.01)
*G11C 11/406* (2006.01)

(52) U.S. Cl.
CPC .......... *G06F 13/00* (2013.01); *G11C 11/40603* (2013.01); *G11C 11/40611* (2013.01)

(58) Field of Classification Search
CPC ...................... G06F 12/00; G11C 11/40603
USPC ....................................................... 711/106
See application file for complete search history.

(56) References Cited

U.S. PATENT DOCUMENTS

| | | | | |
|---|---|---|---|---|
| 4,400,771 | A * | 8/1983 | Suzuki et al. ................. | 711/151 |
| 6,412,048 | B1 | 6/2002 | Chauvel et al. | |
| 6,457,114 | B1 * | 9/2002 | Paluch .......................... | 711/219 |
| 7,343,457 | B1 * | 3/2008 | End, III ........................ | 711/150 |
| 7,719,915 | B2 * | 5/2010 | Tomita et al. ................. | 365/222 |
| 2007/0053235 | A1 * | 3/2007 | Miyatake ...................... | 365/222 |
| 2007/0109897 | A1 * | 5/2007 | Tomita et al. ................. | 365/222 |
| 2007/0198771 | A1 | 8/2007 | Seo | |
| 2008/0225619 | A1 * | 9/2008 | Kawabata ..................... | 365/222 |
| 2009/0157934 | A1 * | 6/2009 | Kato et al. .................... | 710/241 |
| 2010/0095058 | A1 | 4/2010 | Proebsting | |
| 2010/0115142 | A1 | 5/2010 | Lim | |
| 2012/0246544 | A1 | 9/2012 | Resnick et al. | |
| 2014/0047201 | A1 * | 2/2014 | Mehta ........................... | 711/158 |

FOREIGN PATENT DOCUMENTS

JP            2009093495            4/2009

* cited by examiner

*Primary Examiner* — Cheng-Yuan Tseng
*Assistant Examiner* — Zubair Ahmed
(74) *Attorney, Agent, or Firm* — Lawrence J. Bassuk; Charles A. Brill; Frank D. Cimino

(57) ABSTRACT

A system includes multiple master devices and at least one memory refresh scheduler. When a master device needs higher priority for memory access, the master device sends a dynamic priority signal to the memory refresh scheduler and in response, the memory refresh scheduler changes its policy for issuing refresh commands.

4 Claims, 3 Drawing Sheets

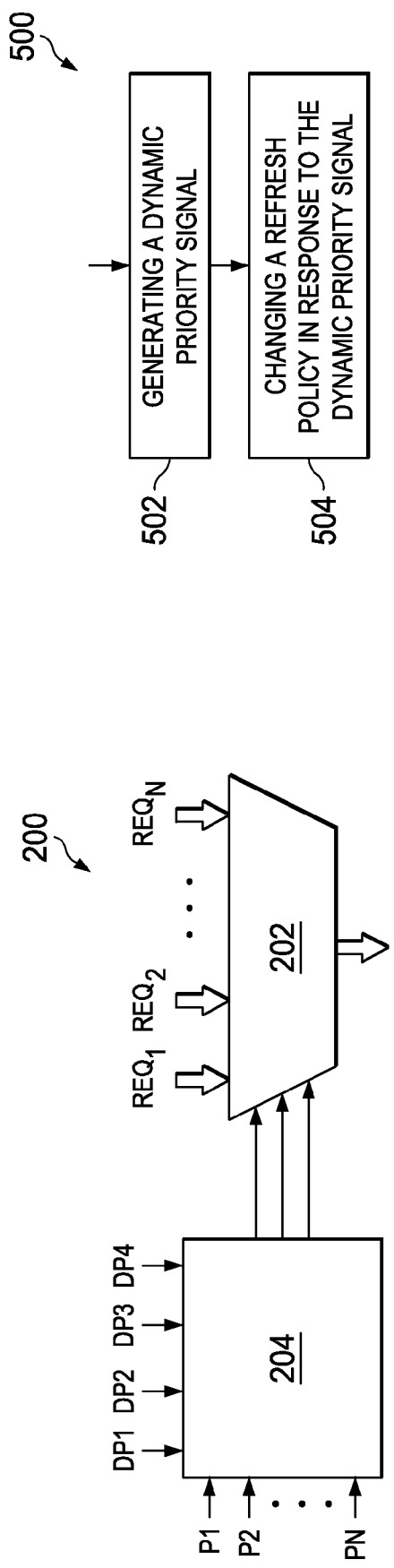
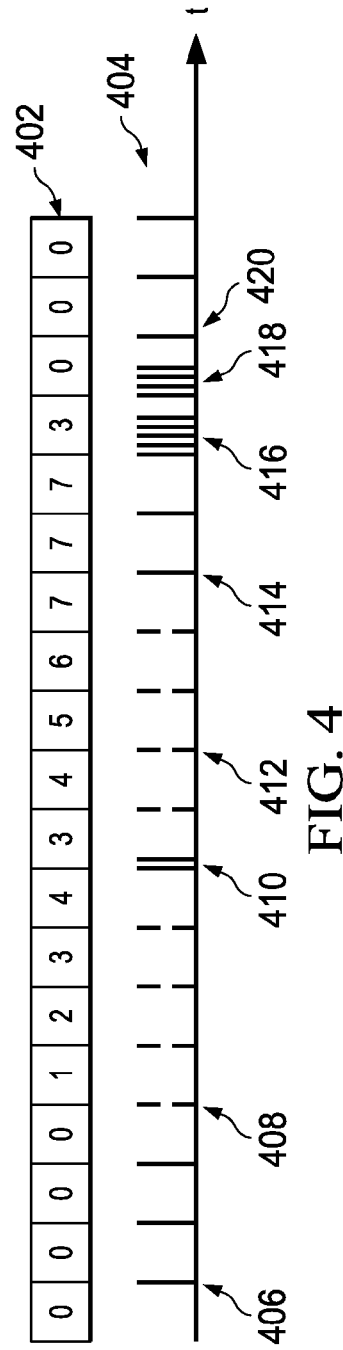

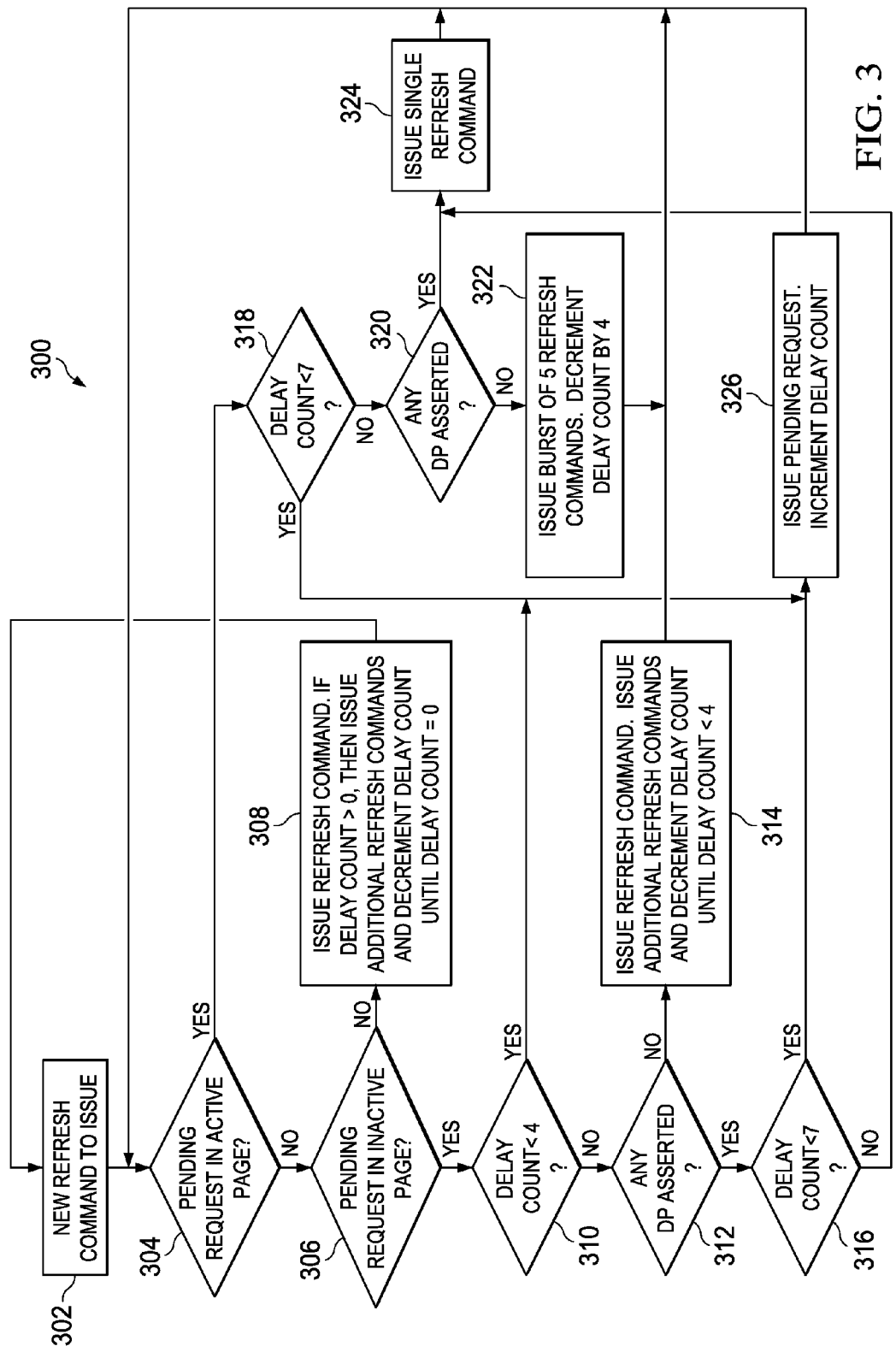

MASTER CIRCUITS HAVING DYNAMIC PRIORITY LEADS COUPLED WITH MEMORY CONTROLLER

This application is based on and claims priority from European Patent Application No. 12290371 filed 25 Oct. 2012, which is incorporated herein by reference.

BACKGROUND

Some complex electronic systems, for example multi-media appliances such as cell phones and tablets, or various multi-processor systems, may have multiple master devices (masters) sharing a single large memory. Masters are any circuits capable of initiating a memory access request to the shared memory. For example, masters may be processors (for example, general purpose microprocessors, graphics processors, microcontrollers, etc.), or subsystems or blocks of logic that need to write to memory after receiving data (for example, a camera sensor), or subsystems or blocks of logic that need to read from memory (for example, a display controller).

Two important memory access measures that affect performance are latency and bandwidth. Overall latency is the time from when a master requests memory access until the time that the first portion of the requested data is received by the master. This document focuses primarily on the time from when a master requests memory access until the time that the request is received by the shared memory. Bandwidth refers to the amount of data that passes through one point per unit of time. This document focuses on bandwidth required for transferring large blocks of data to and from memory.

Various types of masters have different latency and bandwidth requirements. High performance processors require the lowest possible latency to provide maximum performance. Caches are used to reduce the number of external memory accesses, which reduces bandwidth requirements and reduces average latency. However, in the case of a cache miss (with some exceptions such as pre-fetching a line or speculatively reading a line), a processor may be stalled, and in the case of a stall, access to external memory must be served with the lowest possible latency to ensure maximum performance. Some other masters require high bandwidth with a guarantee on average throughput, and therefore a guaranteed average latency. For example, graphics processors must read or write large uninterrupted bursts of data, but they have large local memory buffers that store data that are prefetched in advance, so their latency requirements are relatively relaxed. That is, average throughput is important but latency for a single request can be very high. Other masters, for example a real-time controller streaming data from a camera sensor, need some guaranteed maximum latency. Typically, they have known, regular, and predictable bandwidth requirements and they use local buffers that are optimized to reduce overall system cost. However, buffers optimized for cost cannot guarantee latency. If those buffers should overflow or underflow, then the system might fail to perform a requested operation and temporary performance degradation may not be acceptable. Therefore, there is need for a separate hardware mechanism that can guarantee some maximum latency. Finally, for some masters, timely execution and low latency is not required. For example, data transfer to mass storage or data transfer across a serial link interface is usually not time critical.

Currently, the most commonly used large shared memory is dynamic memory. Dynamic memory typically stores information as a charge or lack of charge in capacitors. However, charged capacitors gradually leak charge. Therefore, dynamic memory must be periodically refreshed (read and rewritten to guarantee that data are not lost). Dynamic Random Access Memory (DRAM) is typically organized into banks, and banks are organized into rows, and refresh is typically performed on an entire row. A common industry standard specifies that each row must be refreshed every 64 milliseconds or less. There may be many thousands of rows. Refresh may be executed one row at a time at uniformly spaced time intervals during the 64 millisecond interval. Alternatively, multiple rows (or even all the rows) may be refreshed in a burst of activity.

For dynamic memory, refresh schedulers in memory controllers must periodically issue memory refresh commands, which may be disruptive for masters that need to access the memory. Dynamic memories allow some delay of memory refresh commands, which may then be issued in bursts, but there is a specified limit on how much delay can be accumulated, and at some point recovery is needed to execute all required refresh commands in a given period.

Each master, including the refresh scheduler, issue requests for memory access, and those requests must be prioritized. In addition, the relative priorities of the requests may need to change dynamically. For example, if a video processor is being used, the video should not pause while waiting on more video data. Therefore, if a data buffer for a video processor becomes nearly empty, the priority of pending memory access requests from the video processor needs to be increased to prevent buffer underflow. Likewise, if memory refresh commands have been delayed for a long time, then the priority of memory refresh needs to be increased. There is an ongoing need to improve priority management of memory access.

BRIEF DESCRIPTION OF THE DRAWINGS

FIG. 2 is a simplified block diagram of an example embodiment of a priority handler within the electronic system of FIG. 1.

FIG. 3 is a flow chart illustrating an example embodiment of a process of scheduling memory refresh commands.

FIG. 4 is a timing diagram illustrating an example embodiment of refresh command timing consistent with the flow chart of FIG. 2.

FIG. 5 is a flow chart illustrating an example embodiment of a method of controlling priority of requests for access to memory.

DETAILED DESCRIPTION

Figure 1:
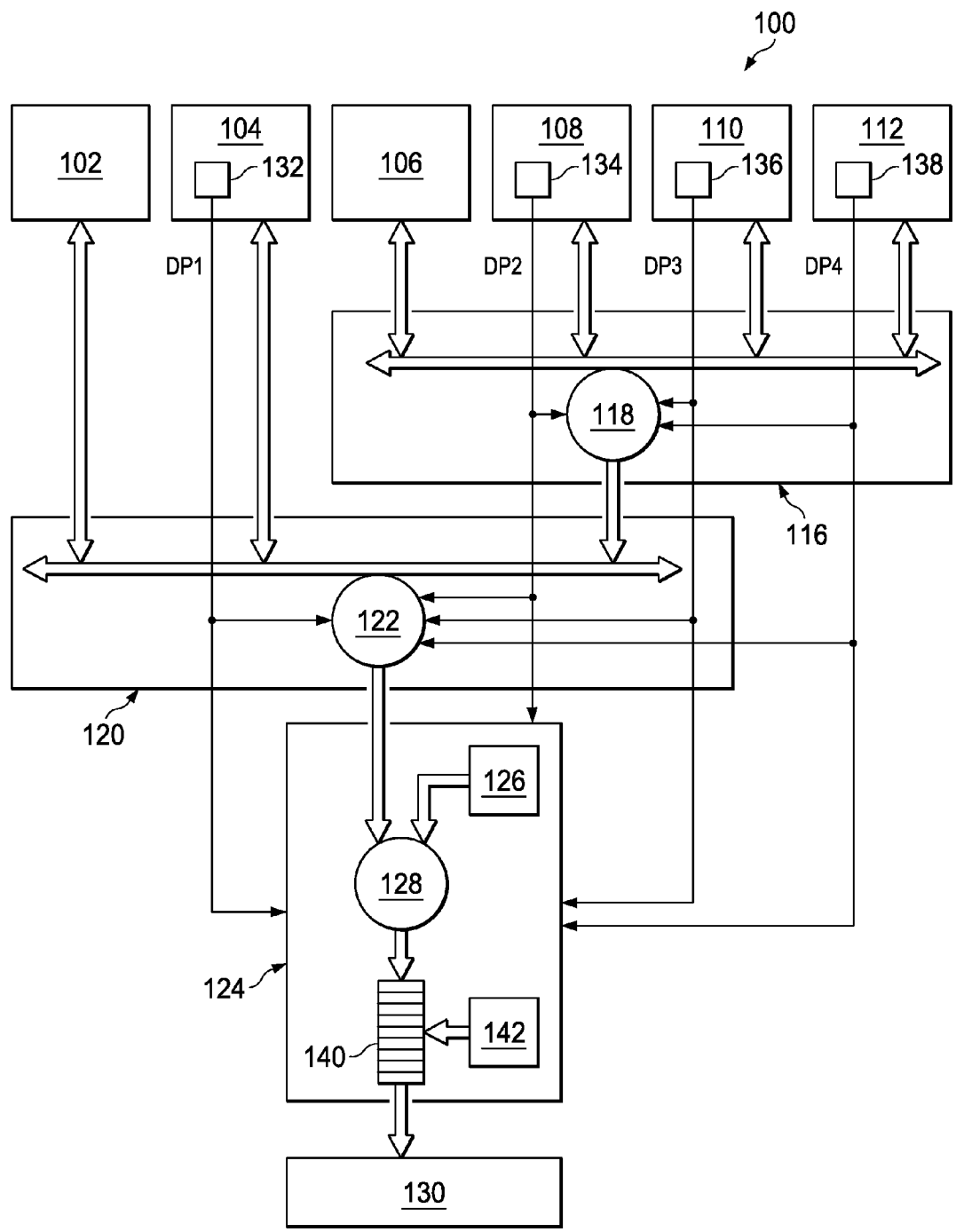
FIG. 1 is a simplified block diagram of an example embodiment of an electronic system.

There is a performance benefit in serving pending access requests from masters prior to issuing a refresh command, and in trying to serve refresh commands when there are no other pending memory access requests. In general, there are a substantial number of overhead clock cycles associated with a memory access, during which the memory bank is busy but is not actually reading or writing data. In general, the overhead penalty can be reduced by using burst operations in which only a single address is required along with a burst size, after which successive data units (for example, words or lines) may be read without additional overhead cycles required for each data unit. Likewise, for refresh, bursts of refresh commands are more overhead efficient than single refresh commands. In addition, issuing refresh commands in a burst reduces the occurrence of memory precharge that potentially creates additional overhead for immediately following access requests from masters. However, long bursts of activity, whether from masters or refresh, mean long periods of time in which other requests for access are delayed. For some memory access requests, there is a limit on how much delay can occur without substantially reducing performance. In addition, permitting bursts of memory access commands has a negative impact on the required size of all buffers and a negative impact on the maximum latency for the various masters.

Each request for memory access may have an associated priority, and when access request delays occur for critical read/write requests, then associated access priorities may be dynamically increased to help maintain overall system performance. Similarly, priorities may need to be lowered from time to time. Typically, dynamic priority only affects access priority within the memory controller. In the examples described below, dynamically changing priorities may affect priority handlers at all levels of arbitration between the initiator and the final shared memory, so that some requests are given priority in route to the memory controller. In addition, in the examples described below, dynamically changing priorities may also change the refresh policy being executed by the memory refresh scheduler.

FIG. 1 illustrates an example embodiment of a portion 100 of an electronic system. The illustrated portion 100 has multiple masters (102-112) sharing a common memory 130. In a complete system, there may be many other structures, including the subsystems controlled by the masters (for example, displays, modems, and cameras), shared memory and cache memories, and various busses and pipelines for data transfer between the masters. However, FIG. 1 only illustrates the parts of the system involved with requests for access to memory, and even those parts are simplified to facilitate illustration and to focus discussion.

In the example of FIG. 1, there are two layers of bidirectional data and address interconnect busses (116, 120). Masters 106-112 send memory access requests through a first interconnect bus 116. Interconnect bus 116 includes a priority handler 118 (discussed in more detail in conjunction with FIG. 2). In the example of FIG. 1, if there are multiple simultaneous memory access requests from masters 106, 110, 108, and 112, then priority handler 118 selects the memory access request having the highest priority among the requests from those four masters. Masters 102 and 104 (and priority handler 118) send memory access requests through a second interconnect bus 120. Interconnect bus 120 includes a priority handler 122. Priority handler 122 selects the memory access request having the highest priority from masters 102 and 104, and the output of priority handler 118. In the example of FIG. 1, a memory controller 124 includes a refresh scheduler 126 and a priority handler 128. The memory controller 124 issues one or more refresh commands, or read or write commands, based on requests from the refresh scheduler 126, and requests pending from the priority handler 122. The memory controller 124 selects through the priority handler 128 the highest priority request among requests from priority handler 122 and the refresh scheduler 126.

In the example of FIG. 1, memory requests from some masters have a priority that is not changed. Memory requests from some other masters have a normal priority that can be changed by a Dynamic Priority (DP) signal. Masters 102 and 106 are depicted as having an initial priority that is not changed. For masters 104, 108, 110, and 112, DP signals may be used to change priority at each of the priority handlers (118, 122, 128). In addition, the DP signals may also modify memory refresh scheduling by the refresh scheduler 126 (discussed in more detail in conjunction with FIG. 3). In addition, the DP signals may also change the order of previously issued but unexecuted memory requests (discussed in more detail below).

In the example of FIG. 1, master 104 is depicted as having a timer 132. Although the timer 132 is illustrated within the master 104, which enables fast setting by software, the timer can be located anywhere in the system. Signal DP1, generated when the timer expires, just needs to be paired with the address bus of a particular master. The timer 132 may be enabled at the beginning of a software task that needs to be completed in a given time. The task may require many memory accesses. The timer may be set to the estimated time required to complete the software task along with the necessary margin needed to recover in case the request is not completed before the expiration of the allocated time. If the timer expires before the completion of the software task, then signal DP1 is asserted until the task is completed. When signal DP1 is asserted, memory access requests preceding the assertion of signal DP1, but still not serviced, will have their priority increased, and all memory access requests issued while signal DP1 is asserted will have their priority increased. On completion of the software task, the timer may be reset by software, clearing signal DP1.

In the example of FIG. 1, masters 108, 110 and 112 are depicted as having buffers (134, 136, 138). If, for example, master 108 is reading data from memory, and buffer 134 reaches a programmed level of emptiness, then signal DP2 may be asserted to increase the priority of memory access requests from master 108. Signal DP2 may then be cleared when buffer 134 reaches a programmed level of fullness. Alternatively, if for example, master 110 is writing data to memory (for example, from a camera sensor), then signal DP3 may be asserted when buffer 136 reaches a programmed level of fullness, and signal DP3 may be cleared when buffer 136 reaches a programmed level of emptiness.

Note that timers and buffers cause DP signals to be asserted asynchronously to requests for memory access by a master. In particular, a timer or buffer may cause a DP signal to be asserted that then affects the priority of multiple pending and subsequent memory access requests from the corresponding master. In some cases, a DP signal may remain asserted long enough to flush all memory access requests that were pending at the time the DP signal was asserted. As a result, a master may gain exclusive access to memory except for refresh commands.

Masters may have an initial priority and that priority may be increased by a fixed amount by asserting a DP signal. Alternatively, the DP signals may be variable. For example, buffer 134 may have multiple levels of emptiness, and signal DP2 may be set to a first increased priority when buffer 134 reaches a first level of emptiness, and signal DP2 may be set to an even higher priority when buffer 134 reaches a second level of emptiness.

Optionally, in the example of FIG. 1, the selected addresses from priority handler 128, along with the associated priority of the addresses, may be pushed onto a First-In First-Out (FIFO) queue (or buffer, or stack) 140. Optionally, reordering logic 142 may reorder the contents of the FIFO 140 to the most appropriate order based on modified priority signals and other memory efficiency criteria (active row, read vs. write, conflict with refresh, etc.). For example, assume that signal DP3 is asserted by master 108. Subsequent memory access requests from master 108 will have a higher priority at priority handlers 118, 122, and 128 as long as signal DP3 is asserted, and optionally, previous memory access requests from master 108 may be reordered within FIFO 140. Optionally, there may also be FIFO's and reordering associated with priority handlers 118 and 122. Note, however, that reordering logic such as logic 142 at the final level of arbitration has visibility of all pending memory access requests at that level. In contrast, for a higher level priority handler (such as priority handlers 118 and 122), there is less visibility of other pending memory access requests at the same level, so reordering may be more complex, and there may be potential coherency issues. Therefore, reordering may preferably be done for a FIFO associated with priority handler 128 only. In addition, there may be FIFO's on the request side of a priority handler. FIG. 1 just shows one example of many alternative configurations.

FIG. 2 illustrates an example embodiment 200 of a priority handler (118, 122, 128). Priority handler 200 includes a multiplexer 202 receiving "N" memory request addresses ($Req_1$, $Req_2$, $Req_N$). Priority logic 204 receives the priorities ($P_1$, $P_2$, $P_N$) of the memory requests as determined by the priority of the requesting masters, and receives the DP signals (DP1, DP2, DP3, DP4). The DP signals, if asserted, modify one or more of the priorities ($P_1$-$P_N$). The priorities ($P_1$-$P_N$) may be part of the access request, or they may be issued from local registers paired with each memory access request. It is not important where the priority signals originate, or where or how they are modified. It is only important that DP signals modify the priority of priority signals. The multiplexer 202 then selects the memory request address having the highest modified priority.

There are multiple reasons why refresh commands may need to be delayed. For example, there are a substantial number of overhead clock cycles associated with switching logical pages in random access memory. If a pending memory access is for the same memory page as the immediately previous access, then it is more efficient for performance to give the pending access a higher priority than a memory refresh command. In contrast, if the pending memory access is for a different page than the immediately previous access, then there is less of a performance penalty if the pending memory access is delayed by a memory refresh command, but if refresh can be delayed, it is still beneficial for performance to give priority to a master. However, there is a limit to how long memory refresh commands can be delayed. If the number of delayed refresh commands reaches a predetermined number, then refresh may need to be given a higher priority. Refresh commands may then be issued in a short burst to reduce the number of delayed refresh commands. However, even if the number of delayed refresh commands is at a high number, the system may have so many pending high priority requests for memory access that it is not practical to issue a burst of memory refresh commands. In particular, in the following examples, if there are pending requests for memory access by masters, and if the number of delayed refresh commands reaches a predetermined number, and if a DP signal is asserted, then instead of a burst, a single refresh command is issued, and the number of delayed refresh commands remains at a high number.

FIG. 3 is a flow chart illustrating an example embodiment of a process 300 that may be executed by the refresh scheduler 126 in FIG. 1. The refresh scheduler may delay refresh commands, and the number of delayed commands may be tracked by a counter (Delay Count). At the beginning of the flow chart in FIG. 3, at step 302, it is time for the refresh scheduler to issue a refresh command, and the process illustrated in the flow chart determines whether the refresh command is delayed, or whether one refresh command is issued, or whether a burst of refresh commands is issued. In the following discussion, system "stress" refers to the need to prioritize masters over refresh. If system stress is low, then refresh commands will be issued at the normally scheduled times. If there is low to moderate system stress, then the refresh policy is to delay refresh commands up to a count of four. If there is moderate to high system stress, then the refresh policy is to delay refresh commands up to a count of seven, and when refresh becomes necessary, a burst of five refresh commands will be issued. At the highest system stress (that is, there is a pending memory access request from a master, there is a DP signal asserted, and the Delay Count is seven), then a burst of refresh commands would harm performance, so the refresh policy is to issue a single refresh command and the number of delayed refresh commands remains at seven.

The following is a detailed discussion of FIG. 3. If there are no pending memory access requests from masters (decisions 304 and 306 are both "NO"), then at step 308 one refresh command is issued. If the Delay Count is greater than zero, then additional refresh commands are issued and the Delay Count is decremented until the Delay Count is zero. If any of the following combinations is true, a pending memory access request from a master is issued, and refresh is delayed, and the Delay Count is incremented (step 326):

1. There is a pending memory access request from a master for the currently active page (decision 304), and Delay Count is less than seven (decision 318).
2. There is a pending memory access request from a master for an inactive page (decision 306), and Delay Count is less than four (decision 310).
3. There is a pending memory access request from a master for an inactive page (decision 306), a DP signal is asserted (decision 312), and Delay Count is less than seven (decision 316).

If there is a pending memory access request from a master, but not to the currently active page (decisions 304 is "NO" and decision 306 is "YES"), and if the Delay Count is at least four (decision 310 is "NO"), and if no DP signal is asserted (decision 312 is "NO"), then the regularly scheduled refresh command is issued, followed by additional refresh commands along with decrementing the Delay Count until the Delay Count is less than four (step 314). If there is a pending memory access request from a master for the currently active page (decision 304 is "YES"), and the Delay Count is at seven (decision 318 is "NO"), and no DP signal is asserted (decision 320 is "NO"), then a burst of five refresh commands are issued and the Delay Count is decremented by four (step 322). That is, at step 322, the regularly scheduled refresh command is issued, followed by an additional burst of four refresh commands to reduce the number of delayed refresh commands by four. If there is a pending memory access request from a master (decision 304 or decision 306 is "YES"), and there is a DP signal asserted (decision 312 or decision 320 is "YES"), and if the Delay Count is at seven (decision 316 is "NO" or decision 318 is "NO"), then a single refresh command is issued (step 324). Note that in step 324 the Delay Count is not decremented so Delay Count remains at seven.

Note that there is an additional possibility for the memory refresh policy that is not illustrated. That is, memory refresh commands may also be issued in advance of their normally scheduled time. In particular, in FIG. 3, at step 308, the refresh scheduler could issue additional refresh commands (for example, seven) in anticipation of the need to delay refresh commands in the future. Note also that the intermediate number of four delayed refresh commands, and the maximum number of seven delayed refresh commands, are just examples. In addition, there may be more than one intermediate threshold.

FIG. 4 is a timing diagram illustrating some of the scenarios discussed in conjunction with FIG. 3. In FIG. 4, row 402 depicts the value of Delay Count as a function of time, and pulses 404 depict refresh commands. A solid pulse indicates an issued refresh command, and a dashed pulse indicates a delayed refresh command. At time 406, the Delay Count is zero, and the conditions are such that step 308 in FIG. 3 is applicable. That is, a single regularly scheduled refresh command is issued. At time 408, the Delay Count is again zero, but the conditions are such that step 326 in FIG. 3 is applicable. That is, the refresh command is delayed, and the Delay Count is incremented. At time 410, the Delay Count has reached four, and the conditions are such that step 314 in FIG. 3 is applicable. That is, the regularly scheduled refresh command is issued, followed by one additional refresh command to bring the Delay Count back to less than four. At time 412, the Delay Count is back to four, but system stress is now high, so that the Delay Count is allowed to increase to seven. At time 414, the Delay Count is seven, and conditions are such that step 324 in FIG. 3 is applicable. That is, a single refresh command is issued, and the Delay Count remains at seven. At time 416, the Delay Count is still at seven, but system stress has relaxed, so that the conditions of step 322 in FIG. 3 are applicable. That is, the regularly scheduled refresh command is issued, followed by a burst of four additional refresh commands (for a total of five), and the Delay Count is decremented by four. At time 418, the conditions are such that step 308 in FIG. 3 are applicable again, except the Delay Count is now 3. The regularly scheduled refresh command is issued, followed by three additional refresh commands (for a total of four), and the Delay Count is decremented to zero. At time 420, the Delay Count is zero again, and step 308 of FIG. 3 is applicable again (one refresh command is issued).

FIG. 5 illustrates a method for controlling memory access. At step 502, a master generates a dynamic priority signal. At step 504, a refresh scheduler changes its refresh policy in response to the dynamic priority signal.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A system comprising:
(A) memory circuitry having memory lead;
(B) memory controller circuitry having memory leads coupled with the memory leads of the memory circuitry, having data interconnect leads, having address interconnect leads, and having a fist dynamic priority input lead;
(C) first master circuitry having data interconnect leads coupled with the data interconnect leads of the memory controller circuitry, having address interconnect leads coupled with the address interconnect leads of the memory controller circuitry, and having a first dynamic priority output lead coupled with the first dynamic priority input lead of the memory controller circuitry; and
(D) second master circuitry having data interconnect leads coupled with the data interconnect leads of the memory controller circuitry, having address interconnect leads coupled with the address interconnect leads of the memory controller circuitry, and being free of any dynamic priority output lead coupled with the memory controller circuitry.

2. The system of clam 1 in which the memory controller includes a second dynamic priority input lead; and including third master circuitry having data interconnect leads coupled with the data interconnect leads of the memory controller circuitry, having address interconnect leads coupled with the address interconnect leads of the memory controller circuitry, and having a second dynamic priority output lead coupled with the second dynamic priority input lead of the memory controller circuitry.

3. The system of claim 1 including bus leads coupling the data interconnect leads of the master circuits with the data interconnect leads of the memory controller circuitry and coupling the address interconnect leads with the address interconnect leads of the memory controller circuitry.

4. The system of claim 1 in which the master circuits include any one or more of a general purpose microprocessor, a graphics processor, a microcontroller, a subsystem, a block of logic that needs to write to memory after receiving data, a camera sensor, a block of logic that needs to read from memory, and a display controller.

* * * * *